United States Patent
Loncar et al.

(10) Patent No.: US 6,252,400 B1
(45) Date of Patent: Jun. 26, 2001

(54) SPIN AND FIELD ECHO (SAFE) FSE

(75) Inventors: Mark J. Loncar, Mentor; Thomas P. Orefice, Painesville Township, both of OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/271,704

(22) Filed: Mar. 18, 1999

(51) Int. Cl.[7] ............................. G01R 33/20; G01V 3/00
(52) U.S. Cl. ............................................. 324/309; 324/307
(58) Field of Search ........................... 324/307, 309, 324/318; 600/410

(56) References Cited

U.S. PATENT DOCUMENTS

| | | | |
|---|---|---|---|
| 4,833,407 | 5/1989 | Holland et al. | 324/309 |
| 5,270,654 | 12/1993 | Feinberg et al. | 324/309 |
| 5,594,336 | 1/1997 | Gullapalli et al. | 324/309 |
| 5,602,476 | 2/1997 | Liu et al. | 324/309 |
| 5,621,321 | 4/1997 | Lui et al. | 324/309 |

OTHER PUBLICATIONS

Thomas Nagele, Uwe Klose, and Wolfgang Grodd, "Numerically Optimized Re–Refocusing Pulses in Localized MR Proton Spectroscopy" Magnetic Resonance Imaging, vol. 11 pp. 785–797 1993. no month.*

Yablonskiy, Dmitriy A., and Haacke, E. Mark "An MRI Method for Measuring T2 in the Presence of Static and RF Magnetic Field Inhomogeneities" Magnetic Resonance in Medicine vol. 37 pp. 872–876 1997 no month.*

\* cited by examiner

Primary Examiner—Christine Oda
Assistant Examiner—Tiffany A. Fetzner
(74) Attorney, Agent, or Firm—Fay, Sharpe, Fagan, Minnich & McKee, LLP

(57) ABSTRACT

The present invention is directed to an MRI apparatus including a main magnet (12) that generates a substantially uniform temporally constant main magnetic field, $B_0$, through an examination region (14) wherein an object being imaged is positioned. A magnetic gradient generator produces magnetic gradients in the main magnetic field across the examination region (14). A transmission system includes an RF transmitter (24) that drives an RF coil (26) which is proximate to the examination region (14). A sequence control (40) manipulates the magnetic gradient generator and the transmission system to produce an MRI pulse sequence. The MRI pulse sequence induces an initial set of contiguous spin echos and a subsequent set of gradient echos which stem from the object. A reception system includes a receiver (30) that receives and demodulates the spin and gradient echos. Ultimately, a reconstruction processor (50) reconstructs an image of the object from data collected via the reception system, and an output device produces a human viewable rendering of the image.

19 Claims, 2 Drawing Sheets

SPIN AND FIELD ECHO (SAFE) FSE

BACKGROUND OF THE INVENTION

The present invention relates to the art of diagnostic medical imaging. It finds particular application in conjunction with magnetic resonance imaging (MRI), and will be described with particular reference thereto. However, it is to be appreciated that the present invention is also amenable to other like applications.

In MRI, a substantially uniform temporally constant main magnetic field, $B_0$, is generated within an examination region. The main magnetic field polarizes the nuclear spin system of a subject being imaged within the examination region. Magnetic resonance is excited in dipoles which align with the magnetic field by transmitting radio frequency (RF) excitation signals into the examination region. Specifically, RF pulses transmitted via an RF coil assembly tip the dipoles out of alignment with the main magnetic field and cause a macroscopic magnetic moment vector to precess around an axis parallel to the main magnetic field. The precessing magnetic moment, in turn, generates a corresponding RF magnetic resonance signal as it relaxes and returns to its former state of alignment with the main magnetic field. The RF magnetic resonance signal is received by the RF coil assembly, and from received signals, an image representation is reconstructed for display on a human viewable display.

Different tissues of the body have different pairs of relaxation properties that are characterized by a pair of time constants: T1 which is the spin-lattice relaxation time, and T2 which is the spin-spin relaxation time. Therefore, different images and visualization of different anatomical structures are obtained depending upon the time constant most heavily relied upon. In this regard, a T1 weighted image is one in which the intensity contrast between any two tissues in an image is due mainly to the T1 relaxation properties of the tissue, and a T2 weighted image is one in which the intensity contrast between any two tissues in an image is due mainly to the T2 relaxation properties of the tissue.

In any event, the appropriate frequency for exciting resonance in selected dipoles is governed by the Larmor equation. That is to say, the precession frequency of a dipole in a magnetic field, and hence the appropriate frequency for exciting resonance in that dipole, is a product of the gyromagnetic ratio $\gamma$ of the dipole and the strength of the magnetic field. In a 1.5 T magnetic field, hydrogen ($^1H$) dipoles have a resonance frequency of approximately 64 MHZ. Generally in MRI, the hydrogen species is excited because of its abundance and because it yields a strong MR signal. As a result, typical MRI apparatus are equipped with built-in whole-body RF coils tuned to the resonant frequency for hydrogen.

For certain applications it is desirable to obtain a $T_1$ weighted image. Moreover, at times, having a spin echo (i.e., an echo derived from application of an RF pulse) image appearance is also advantageous. There are however obstacles to overcome, such as timeliness and specific absorption rate (SAR). With regard to the SAR, SAR=Joules of RF/Second/kg of body weight=Watts/kg. When the SAR is high, it leads to unwanted heating and potential burning of body tissue. That is to say, introduction of high levels of high energy RF pulses into the patient being imaged has the potential of burning the patient.

While prior MRI techniques have been adequate for their intended purposes, certain drawbacks make them less than ideal for the task at hand. For example, the typical spin echo (SE) technique has a relatively low SAR compared to other MRI sequences. However, the main disadvantage of the typical SE technique is that the acquisition time is lengthy relative to other techniques which collect multiple echos per TR (i.e., the time to repeat, or in other words, the time between excitations). While the conventional fast spin echo (FSE) technique results in improved timeliness over the SE technique, its introduction of high energy RF refocussing pulses leads to increased SAR issues. The SAR issues can be reduced through the use of a conventional gradient and spin echo (GSE) technique. However, the disadvantage of the typical GSE technique is that the TE (i.e., the time to echo, or in other words, the time from excitation to spin echo) is longer than desirable for a T1 weighted image due to the fact that one or more field echos or gradient echos (i.e., echos generated as a result of a magnetic gradient switching polarities) are acquired prior to the spin echo. Moreover, the typical GSE technique, through its particular use of field echos, reduces the true spin echo nature of the image and introduces artifacts typically associated with field echo imaging, such as susceptibility.

The present invention contemplates a new and improved MRI technique which overcomes the above-referenced problems and others.

SUMMARY OF THE INVENTION

In accordance with one aspect of the present invention, a method of MRI is provided. It includes inducing with an MRI apparatus a series of spin echos which issue from a subject being imaged without inducing intervening echos therebetween. The spin echos are received with the MRI apparatus in due course. Thereafter, the MRI apparatus is employed to induce a series of gradient echos which issue from the subject being imaged following the series of spin echos. Like the spin echos, the gradient echos are received with the MRI apparatus. Ultimately, an image representation of the subject is reconstructed from the received spin and gradient echos.

In accordance with a more limited aspect of the present invention, the series of spin echos consists of three spin echos.

In accordance with a more limited aspect of the present invention, the series of gradient echos consists of one gradient echo.

In accordance with a more limited aspect of the present invention, the spin echos are induced with the MRI apparatus by subjecting the subject to an initial resonance exciting RF pulse and a subsequent series of refocusing RF pulses. Each spin echo is induced following its corresponding refocusing RF pulse.

In accordance with a more limited aspect of the present invention, the resonance exciting RF pulse has a 90° flip angle, and the refocusing RF pulses have a 180° flip angle.

In accordance with a more limited aspect of the present invention, the series of gradient echos are induced with the MRI apparatus by subjecting the subject to a series of magnetic gradient pulses.

In accordance with a more limited aspect of the present invention, the method further includes repeating the echo inducing and receiving steps a plurality of times such that with each iteration a multiple echo acquisition is received with the MRI apparatus.

In accordance with a more limited aspect of the present invention, more spin echos are induced and received than gradient echos.

In accordance with a more limited aspect of the present invention, the reconstruction step includes: sampling data from the received spin and gradient echos; mapping the sampled data into k-space with data from the gradient echos filling in outermost sections of k-space; and, transforming the data in k-space to reconstruct the image representation of the subject.

In accordance with another aspect of the present invention, a pulse sequence for use in an MRI apparatus is provided. It includes a set of RF pulses applied to an RF coil of the MRI apparatus. The set of RF pulses induces a set of multiple contiguous spin echos that issue from a subject being imaged. The pulse sequence also includes a set of gradient pulses applied to a gradient coil assembly of the MRI apparatus. The set of gradient pulses induces a set of gradient echos that issue from the subject being imaged following the set of multiple contiguous spin echos.

In accordance with a more limited aspect of the present invention, the set of multiple contiguous spin echos includes three spin echos.

In accordance with a more limited aspect of the present invention, the set of gradient echos includes one gradient echo.

In accordance with a more limited aspect of the present invention, the set of multiple contiguous spin echos includes more echos than the set of gradient echos.

In accordance with a more limited aspect of the present invention, the set of RF pulses includes an initial RF excitation pulse having a 90° flip angle and multiple RF refocusing pulses having 180° flip angles.

In accordance with a more limited aspect of the present invention, the pulse sequence further includes: a set of slice selection pulses applied to the gradient coil assembly such that the set of multiple contiguous spin echos and the set of gradient echos issue from a desired cross-sectional slice of the subject being imaged; a set of phase encode pulses applied to the gradient coil assembly such that the set of multiple contiguous spin echos and the set of gradient echos are phase encoded along a first direction within the desired cross-sectional slice; and, a set of frequency encode pulses applied to the gradient coil assembly such that the set of multiple contiguous spin echos and the set of gradient echos are frequency encoded along a second direction within the desired cross-sectional slice. The second direction is orthogonal to the first direction.

In accordance with another aspect of the present invention, an MRI apparatus is provided. It includes a main magnet that generates a substantially uniform temporally constant main magnetic field through an examination region wherein an object being imaged is positioned. A magnetic gradient generator produces magnetic gradients in the main magnetic field across the examination region. A transmission system includes an RF transmitter that drives an RF coil which is proximate to the examination region. A sequence control manipulates the magnetic gradient generator and the transmission system to produce an MRI pulse sequence. The MRI pulse sequence induces an initial set of contiguous spin echos and a subsequent set of gradient echos which stem from the object. A reception system includes a receiver that receives and demodulates the spin and gradient echos. Ultimately, a reconstruction processor reconstructs an image of the object from data collected via the reception system, and an output device produces a human viewable rendering of the image.

In accordance with a more limited aspect of the present invention, the set of contiguous spin echos includes more echos than the set of gradient echos.

In accordance with a more limited aspect of the present invention, the set of gradient echos consists of one gradient echo.

In accordance with a more limited aspect of the present invention, the set of contiguous spin echos includes three spin echos.

One advantage of the present invention is reduced SAR.

Another advantage of the present invention is timely acquisition of T1 weighted images having spin echo image appearance.

Another advantage of the present invention is the reduced time per slice which permits the use of a shortened TR for a given number of slices or alternately more slices for a given TR.

Yet another advantage of the present invention is a reduction in the magnetic transfer contrast (MTC) effect.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
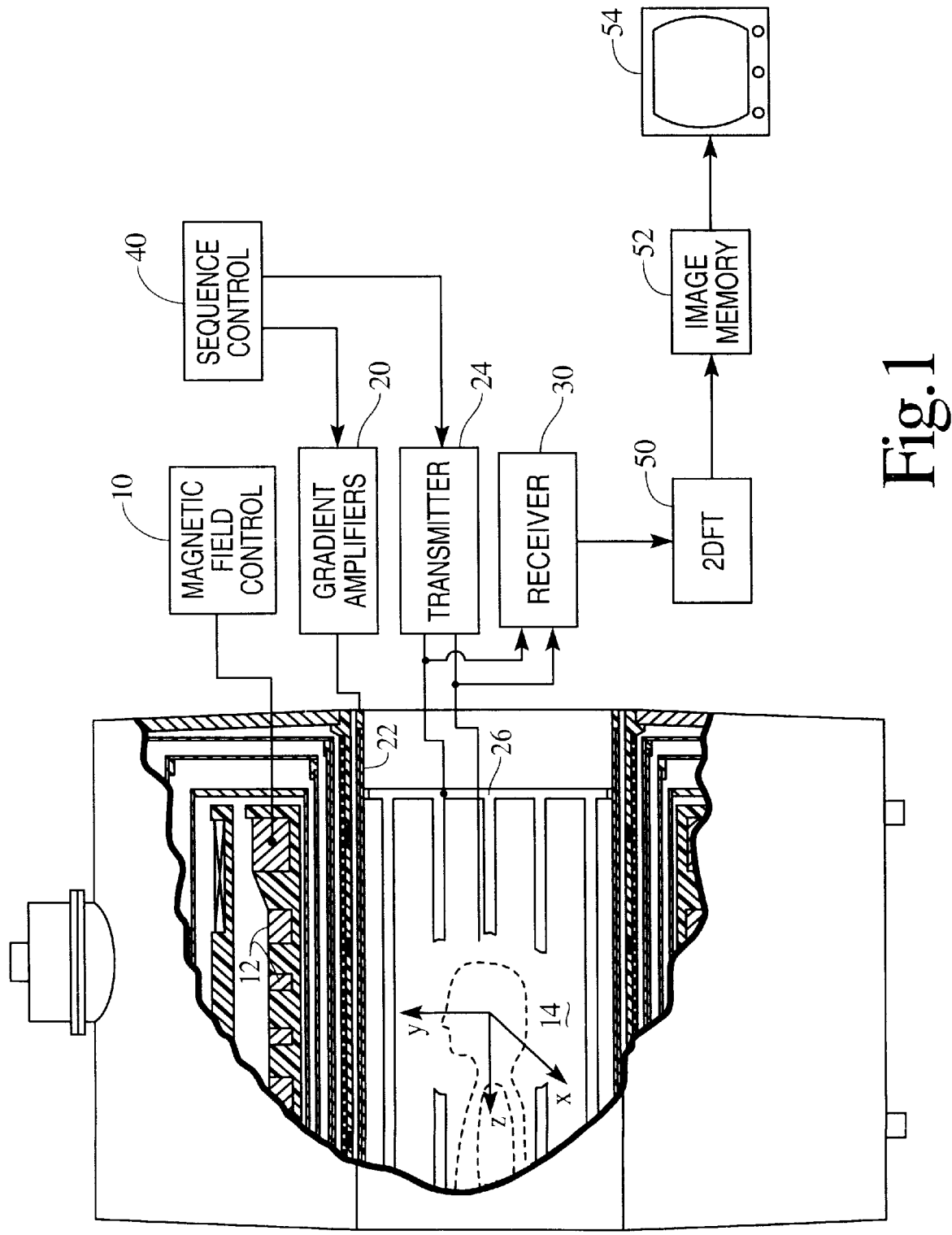
FIG. 1 is a diagrammatic illustration of an MRI apparatus in accordance with aspects of the present invention; and, FIG. 2 is a diagrammatic illustration of an MRI pulse sequence in accordance with aspects of the present invention.

With reference to FIG. 1, a main magnetic field control 10 controls superconducting or resistive magnets 12 such that a substantially uniform temporally constant main magnetic field, $B_0$, is created along a z axis through an examination region 14. A couch (not illustrated) suspends and/or positions an object to be examined, such as a patient or phantom, within the examination region 14. A magnetic resonance echo means applies a series of RF and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate MRI sequences. More specifically, gradient pulse amplifiers 20 apply current pulses to selected ones or pairs of gradient coil assemblies 22 to create magnetic field gradients along x, y, and z axes of the examination region 14. A digital RF transmitter 24 drives a whole-body RF coil 26 to transmit RF pulses or pulse packets into the examination region 14. A typical RF pulse is composed of a packet of immediately contiguous pulse segments of short duration, which taken together with each other and any applied gradients, achieve a selected magnetic resonance manipulation. For whole-body applications, the resonance signals or echos are commonly picked up by the whole-body RF coil 26.

For generating images of local regions of the subject, specialized RF coils are placed contiguous to the selected region of interest. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals introduced by the whole-body RF coil 26. In any event, the resultant RF signals are picked up by the whole-body RF coil 26, the insertable RF coil, or other specialized RF coil and demodulated by a receiver 30, preferably a digital receiver.

In a preferred embodiment of the present invention, a sequence control circuit 40 controls the gradient pulse amplifiers 20 and the transmitter 24 to generate a multiple echo MRI sequences. For the selected sequence, the receiver 30 receives a plurality of data lines in rapid succession following each RF excitation pulse. Ultimately, the RF signals are received, demodulated, and reconstructed into an image representation by a reconstruction processor 50 which applies a two-dimensional (2D) Fourier transform or other appropriate reconstruction algorithm. The image may represent a planar slice through the patient, an array of parallel planar slices, a three-dimensional volume, or the like. The image is then stored in an image memory 52 where it is accessed by a display, such as a video monitor 54 or other human viewable display or output device that provides a rendering of the resultant image.

While the invention herein is described with reference to the MRI apparatus detailed above, it is appreciated that the invention is applicable to other MRI apparatus. For example, the invention is equally amenable to open geometry magnets wherein opposing pole pieces, joined by a ferrous flux return path, define an examination region therebetween.

Figure 2:
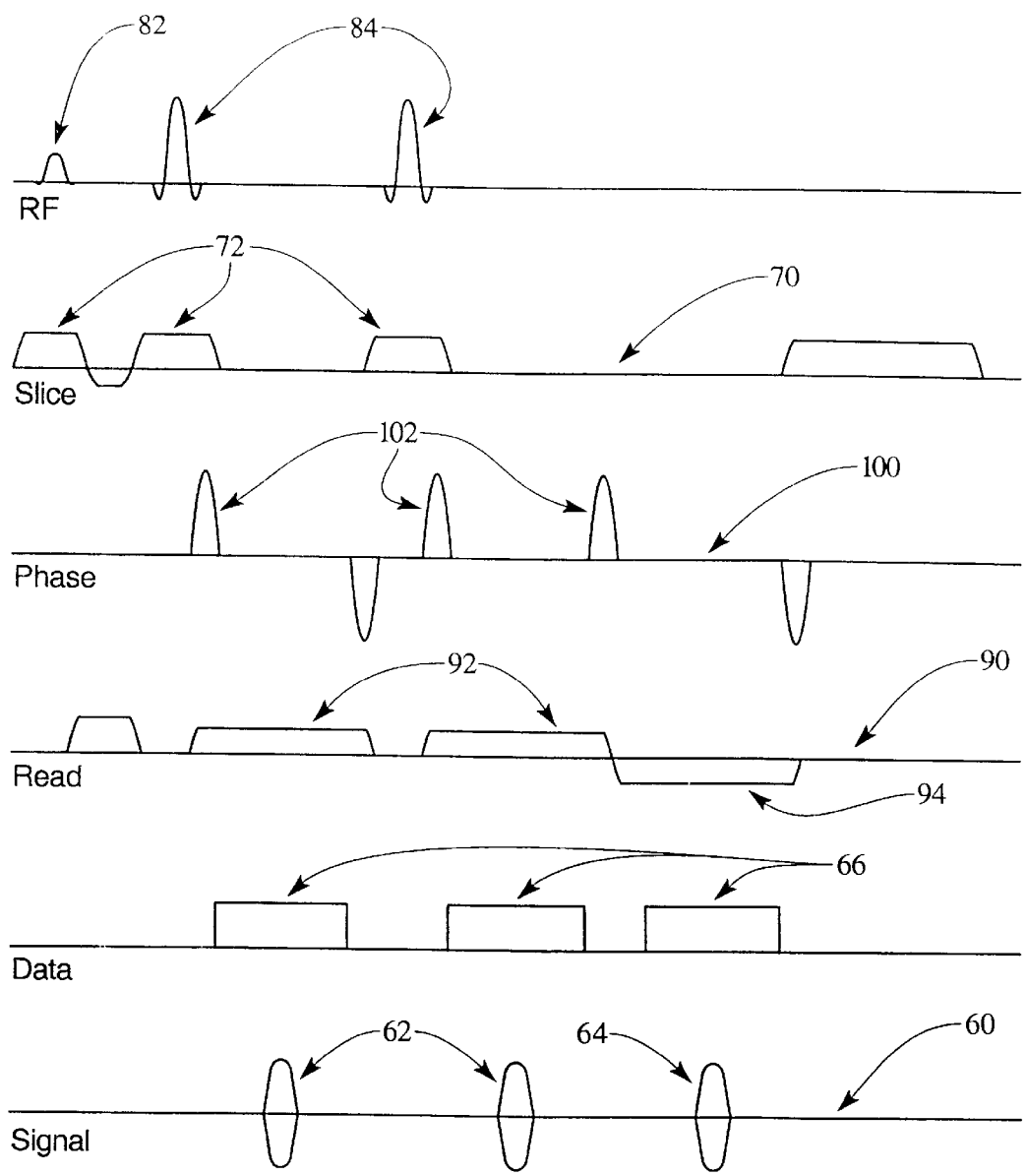

In any event, with reference to FIG. 2 and continuing reference to FIG. 1, the sequence control 40 initiates and directs an MRI pulse sequence that generates the signal 60 received by the receiver 30. In a preferred embodiment of the present invention, the MRI pulse sequence initially begins like an FSE sequence generating a number of spin echos 62, however, after the final spin echo is generated, one or more field echos (also known as gradient echos) 64 and, are generated. The spin and field echos 62 and 64 are collected within a data acquisition window 66.

More specifically, the MRI sequence is described by way of the example sequence depicted in FIG. 2. During a slice selection sequence 70 separate slice select gradient pulses 72 are applied to the gradient coil assembly 22 to select a cross-sectional slice of the object in which resonance is to be excited and from which the spin and gradient echos 62 and 64 ultimately issue. Simultaneously with the slice select gradient pulses 72, a series of RF pulses are applied to the RF coil 26 via the RF transmitter 24. In the exemplary sequence, the RF pulses include an initial 90° flip angle resonance exciting RF pulse 82 followed by a series of 180° flip angle refocusing RF pulses 84. The application of each refocusing pulse 84 results in the generation of a spin echo 62 thereafter.

A readout pulse sequence 90 applied to the gradient coil assembly 22 frequency encodes the received MRI signal 60 along a first direction within the selected slice. The spin echos 62 are read out under readout gradient pulses 92 having a first polarity. The transition in polarity of readout gradient pulse 94 from that of the previous readout gradient pulse results in the generation of the gradient echo 64 which is then also read out under the readout gradient pulse 94.

In addition to frequency encoding, the received MRI signal 60 is also phase encoded via a phase encode pulse sequence 100 applied to the gradient coil assembly 22. The phase encode pulse sequence 100 includes a number of phase encode gradient pulses 102 which are applied prior to the spin and gradient echos 62 and 64 to impart phase encoding thereto. The phase encoding is applied along a second direction within the selected slice which second direction is orthogonal to the first or frequency encoding direction. The individual spin and gradient echos 62 and 64 are separately phase encoded by varying the amplitude and/or duration of the phase encoding gradient pulses 102.

As each echo is collected and/or sampled by the receiver 30, the raw MR data is loaded into a memory matrix otherwise known as k-space. It is this raw data in k-space that is the object of the 2D Fourier transform or other appropriate reconstruction algorithm carried out by the reconstruction processor 50. Each of the collected echos is mapped into its own corresponding row or horizontal line of k-space such that each successively sampled data value occupies successive columns. The row each echo is assigned to is based on the particular phase encoding imparted thereto via the phase encoding gradient pulses 102. In a preferred embodiment, a first collected spin echo 62 is mapped to a central line of k-space while successively collected echos are mapped to further out neighboring lines of k-space in a progressive manner alternating between positive (i.e., above the central line) and negative (i.e., below the central line) k-space. Hence, the later collected gradient echos 64 end up filling the outermost portions of k-space.

In a preferred embodiment, a single excitation gives rise to a multiple echo acquisition over a time TR. In the illustrated example, the multi-echo acquisition includes a series of two consecutive spin echos 62 followed by a single gradient echo 64. Alternately, in another preferred embodiment, the multi-echo acquisition includes three spin echos 62 followed by a single gradient echo 64. Still further variations in the number of echos as desired are contemplate such that a series of spin echos (without intervening echos) are induced followed by a series of gradient echos. Moreover, while described above in terms of 2D or cross-sectional slice imaging, the invention is equally applicable to 3D or volume imaging where in a volume of the object is excited rather than a slice.

In any event, the initial employment of the FSE technique allows multiple echo acquisition per TR thereby shortening the overall scan time. Replacement of otherwise generated spin echos at the end of a generated echo train with gradient echos reduces the number of high energy 180° flip angle RF pulses which would otherwise be employed. This in turn reduces the relative SAR. Moreover, the lack of intervening echos between the generated spin echos permits the TE to be sufficiently short for T1 weighted images. In this manner, a T1 weighted image is achieved in a timely manner with reduced SAR. While the reduction of SAR is a benefit in and of itself, reduced SAR also results in a reduction in the MTC effect which consequently provides improved T1 contrast. Additionally, a spin echo image appearance is maintained as the central dominate portion of k-space is filled with data from spin echos while the outermost portions are filled with data from the gradient echos.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of MRI comprising:
   (a) inducing with an MRI apparatus a multiple spin echo signal which issues from a subject being imaged without inducing intervening echoes therebetween, said multiple spin echo signal including a plurality of consecutive spin echos;
   (b) receiving the spin echos with the MRI apparatus;
   (c) inducing with the MRI apparatus a series of gradient echos which issue from the subject being imaged following the multiple spin echo signal;
   (d) receiving the gradient echos with the MRI apparatus; and,
   (e) reconstructing an image representation of the subject from the received spin and gradient echos.

2. The method of MRI according to claim 1, wherein the plurality of consecutive spin echos consists of three spin echos.

3. The method of MRI according to claim 2, wherein the series of gradient echos consists of one gradient echo.

4. The method of MRI according to claim 1, wherein step (a) comprises:
   subjecting the subject to an initial resonance exciting RF pulse with the MRI apparatus; and,
   subjecting the subject to a subsequent series of refocusing RF pulses with the MRI apparatus to induce the spin echos, each spin echo being induced after its corresponding refocusing RF pulse.

5. The method of MRI according to claim 4, wherein the resonance exciting RF pulse has a 90° flip angle and the refocusing RF pulses have a 180° flip angle.

6. The method of MRI according to claim 1, wherein step (c) comprises:
   subjecting the subject to a series of magnetic gradient pulses with the MRI apparatus to induce the series of gradient echos.

7. The method of MRI according to claim 1, further comprising:
   repeating steps (a) through (d) a plurality of times such that with each iteration a multiple echo acquisition is received with the MRI apparatus.

8. The method of MRI according to claim 1, wherein more spin echos are induced and received than gradient echos.

9. The method of MRI according to claim 1, wherein step (e) comprises:
   sampling data from the received spin and gradient echos;
   mapping the sampled data into k-space with data from the gradient echos filling in outermost sections of k-space; and,
   transforming the data in k-space to reconstruct the image representation of the subject.

10. A pulse sequence for use in an MRI apparatus, said pulse sequence comprising:
    a set of RF pulses applied to an RF coil of the MRI apparatus wherein said set of RF pulses induces a signal that issues from a subject being imaged, said signal including a set of multiple contiguous spin echos; and,
    a set of gradient pulses applied to a gradient coil assembly of the MRI apparatus wherein said set of gradient pulses induces a set of gradient echos that issue from the subject being imaged following said set of multiple contiguous spin echos.

11. The pulse sequence according to claim 10, wherein said set of multiple contiguous spin echos includes three spin echos.

12. The pulse sequence according to claim 11, wherein said set of gradient echos includes one gradient echo.

13. The pulse sequence according to claim 10, wherein said set of multiple contiguous spin echos includes more echos than said set of gradient echos.

14. The pulse sequence according to claim 10, wherein the set of RF pulses comprises:
    an initial RF excitation pulse having a 90° flip angle; and,
    multiple RF refocusing pulses having 180° flip angles.

15. The pulse sequence according to claim 10, further comprising:
    a set of slice selection pulses applied to the gradient coil assembly such that the set of multiple contiguous spin echos and the set of gradient echos issue from a desired cross-sectional slice of the subject being imaged;
    a set of phase encode pulses applied to the gradient coil assembly such that the set of multiple contiguous spin echos and the set of gradient echos are phase encoded along a first direction within the desired cross-sectional slice; and,
    a set of frequency encode pulses applied to the gradient coil assembly such that the set of multiple contiguous spin echos and the set of gradient echos are frequency encoded along a second direction within the desired cross-sectional slice, said second direction being orthogonal to the first direction.

16. A MRI apparatus comprising:
    a main magnet that generates a substantially uniform temporally constant main magnetic field through a examination region wherein an object being imaged is positioned;
    a magnetic gradient generator that produces magnetic gradients in the main magnetic field across the examination region;
    a transmission system which includes an RF transmitter that drives an RF coil which is proximate to the examination region;
    a sequence control which manipulates the magnetic gradient generator and the transmission system to produce an MRI pulse sequence, said MRI pulse sequence inducing a signal including an initial set of multiple contiguous spin echos and a subsequent set of gradient echos which stem from the object;
    a reception system which includes a receiver that receives and demodulates the spin and gradient echos;
    a reconstruction processor that reconstructs an image of the object from data collected via the reception system; and,
    an output device that produces a human viewable rendering of the image.

17. The MRI apparatus according to claim 16, wherein the set of multiple contiguous spin echos includes more echos than the set of gradient echos.

18. The MRI apparatus according to claim 17, wherein the set of gradient echos consists of one gradient echo.

19. The MRI apparatus according to claim 18, wherein the set of multiple contiguous spin echos includes three spin echos.

* * * * *